APPLYING LAYERS OF MATERIALS TO SEMICONDUCTOR BODIES

Filed Aug. 14, 1959 2 Sheets-Sheet 1

WITNESSES
John E. Healy Jr.
Charles L. Menzemer

INVENTOR
Harold F. John
BY
Frederick Shapoe
ATTORNEY

APPLYING LAYERS OF MATERIALS TO SEMICONDUCTOR BODIES

Filed Aug. 14, 1959 2 Sheets-Sheet 2

United States Patent Office 3,195,217
Patented July 20, 1965

3,195,217
APPLYING LAYERS OF MATERIALS TO SEMICONDUCTOR BODIES

Harold F. John, Wilkinsburg, Pa., assignor to Westinghouse Electric Corporation, East Pittsburgh, Pa., a corporation of Pennsylvania Filed Aug. 14, 1959, Ser. No. 833,862
12 Claims. (Cl. 29—25.3)

This invention relates to a process for establishing semiconductor transition regions within, and affixing good electrical contacts to, a body of a semiconductor material.

In the past, semiconductor transition regions and electrical contacts have been made within and affixed to a body of a semiconductor material by either the alloy fusion technique or the vapor deposition technique, or a combination of both.

The formation of a p-n junction (semiconductor transition region) and ohmic electrical contacts on semiconducting materials by the alloy fusion technique is usually achieved in the following manner. Pieces of doping material are cut into pellets or other shapes of the desired size and placed on the body of semiconductor material. Very frequently jigs of a complex and precise construction are necessary to keep the doping or contact pellets, foils or the like in place. The assembly is subsequently heated to a temperature to cause alloying and doping.

In the vapor deposition technique, metals are evaporated onto a surface of a body of a semiconductor material, with masks being employed to confine the vapor deposits to the desired area.

While both these techniques have found wide acceptance in the industry, there are certain disadvantages inherent in each. For example, the alloy fusion technique requires a multitude of shaping, cleaning, and handling operations for the pellets, foils and the like, which are used. The wetting characteristics of the alloy or metal pellets present problems resulting in erratic or non-uniform doping and bonding. The correct positioning of the pellets and foils also presents difficulties. The alloy pellet process generally does not lend itself readily to an automatic production process. The vapor diffusion process must be carried out in a good vacuum, is markedly affected by traces of impurities, has limits as to which materials may be employed, and in general does not lend itself readily to an automatic production process.

An object of the present invention is to provide a new and improved process for affixing electrical contacts, both ohmic and doping, to a body of a semiconductor material comprising, depositing a plurality of layers of contact material upon a predetermined portion of the body of semiconductor material by directing a high temperature, high velocity jet containing the contact material, in finely divided particle form, against predetermined portions of the body of semiconductor material.

Another object of the present invention is to provide a new and improved process for establishing a semiconductor transition region within a body of a semiconductor material comprising, employing a high temperature, high velocity plasma-jet of an ionized gas to drive a quantity of a suitable doping material into the body of semiconductor material.

Another object of the present invention is to provide a process embodying a high velocity plasma-jet of particles of contact materials for establishing semiconductor transition regions within and affixing electrical contacts to an elongated body of a semiconductor material, which process lends itself readily to automatic production methods.

Other objects of the present invention will, in part, be obvious and will, in part, appear hereinafter.

For a better understanding of the nature and objects of the present invention, reference should be had to the following detailed description and drawings in which.

In accordance with the present invention and attainment of the foregoing objects, there is provided a process for affixing electrical contacts to a body of a semiconductor material comprising, directing a high temperature, high velocity jet comprised of an intimate admixture of an ionized inert gas and particles of an electrical contact material against a predetermined portion of said body of semiconductor material, whereby one or more highly adherent layers of the electrically conductive material is driven into and deposited upon the predetermined portion of the body of semiconductor material. The applied layer of electrical contact material may provide for doping of the semiconductor material, for an ohmic contact or for a supporting base, for the body of semiconductor material.

The term "semiconductor material" as used herein is meant to include all material, both intrinsic and extrinsic, which conduct electricity by the movement of electrons and/or holes and for which energy is required to raise electrons to the conduction band or to produce holes, and which have an electron or hole carrier density within the range of $10^{10}$ to $10^{22}$ carriers per cu. cm. of material, examples of which include, but are not limited to, silicon; germanium; silicon carbide; Group III-Group V compounds, examples of which include, but are not limited to, indium antimonide, indium arsenide, gallium arsenide; and mixed valence semiconductor compounds, such as germanium telluride, lead telluride, bismuth antimonide, zinc antimonide and the like, which are used widely in thermoelectric devices.

The term "electrical contact" as used herein is meant to include ohmic contacts, emitter contacts, base contacts and collector contacts.

Figure 1:
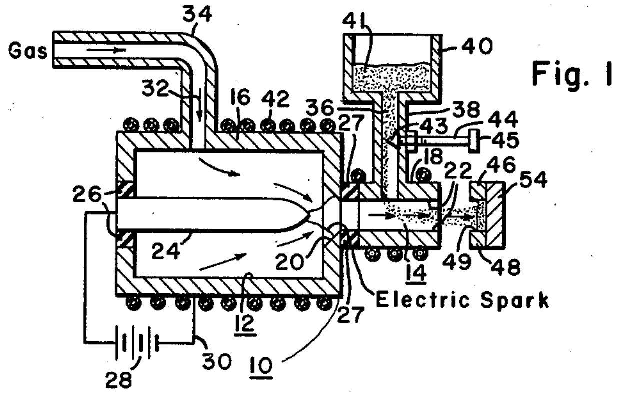
FIG. 1 is a side view in partial cross-section of the plasma-jet generator and a body of a semiconductor material undergoing processing in accordance with the teaching of this invention.

With reference to FIG. 1, there is illustrated a plasma-jet generator 10 suitable for use in accordance with the teachings of this invention. The plasma-jet generator 10 is comprised of a first chamber 12, which is a gas ionization chamber, and a second chamber 14, which is an orifice chamber. The first chamber 12 is provided by a wall 16, and the orifice chamber 14 is provided by a wall 18. The walls 16 and 18 are comprised of good heat and electrical conductors, for example, copper, aluminum, graphite, steel and the like. They may comprise portions coated or formed of ceramics, plastics and the like. The chambers 12 and 14 are interconnected by an orifice opening 20 in wall 16. Chamber 14 is open to the ambient surrounding through an orifice opening 22. An electrode 24 is disposed substantially centrally within chamber 12. The electrode 24 extends from the back wall of the chamber 12 to a point just short of and centered with respect to the orifice opening 20. The electrode 24 is electrically insulated from the wall 16 by suitable electrical insulation 26. The chambers 12 and 14 are insulated from each other by suitable electrical insulation 27.

The electrode 24 may be of either the consumable or nonconsumable type and may be comprised of, for example, tungsten, silver, carbon, and alloys and mixtures thereof.

The electrical insulation 26 which serves to insulate the electrode 24 from wall 16 may be ceramic, rubber, for example, a neoprene rubber, or a resin, for example, polytrifluoroethylene or a filled rubber or filled resin or mixtures thereof. The insulation 27 insulating chamber 12 from chamber 14 may be of the same or similar composition as insulation 26.

The electrode 24 is biased negative relative to wall 16 through a direct-current power source 28 and a conductor 30.

A gas inlet passageway 32, formed by a tube 34, opens into the first chamber 12.

An inlet passageway 36, formed by a suitable conduit 38, has one end opening into chamber 14 and the other end connected to a tank 40. Tank 40 contains at least one powered material 41, such as a metal or mixture of the contact materials, to be coated onto a predetermined portion of a body of a semiconductor material. A control valve 44 operable by handle 45 has a point 43 disposed in passageway 36 to restrict the flow of powdered material 41 therethrough in desired amounts.

Walls 16 and 18 of chambers 12 and 14, respectively, are surrounded by cooling coils 42, for example, hollow copper coils, through which a cooling fluid is pumped.

With reference to the operation of the apparatus of FIG. 1, in one method of practicing the techniques of this invention to establish a semiconductor transsition region within a body of a semiconductor material, a body or wafer 54 of a semiconductor material having a first-type of semiconductivity is disposed from approximately 0.5 inch to 5.0 inches from orifice 22 of the plasma-jet generator 10. Very satisfactory results have been realized when the body of semiconductor materials has been disposed a distance of from 1 inch to 2.5 inches from the exit orifice opening 22.

A mask 48 with aperture 49 is disposed upon the surface 52 of the wafer to cover the portions that it is desired to retain the first type of semiconductivity.

The aperture 49 exposes the portions to be coated with contact material. The nature of the mask 48 will depend on the composition of wafer 54. The mask may be any suitable inert material, for example, graphite, a metal such as molybdenum, or a ceramic material. If wafer 54 is silicon, a mask may be produced directly thereon by oxidizing the surface in a furnace to a depth of a few mils, etching of the silica from selected portions whereby a layer of silicon dioxide is provided to mask the rest of the surface. The technique of masking is well known to those skilled in the art, and it is therefore not necessary for the comprehension of this invention to provide an exhaustive explanation thereof herein.

A quantity of at least one suitable electrical contact and doping material, capable of establishing a second type of conductivity within the wafer 54 is charged into the tank 40. Examples of suitable doping materials for n- and p-type silicon and germanium include: if wafer 54 is n-type silicon, aluminum, silver-boron, indium, gold-boron and the like; if wafer 54 is a p-type silicon, phosphorus, arsenic, and antimony, above, or with an inert carrier metal such as gold, silver, tin or lead; if wafer 54 is n-type germanium, aluminum, indium, indium-gallium alloys and admixtures and the like; and if wafer 54 is p-type germanium, lead-antimony, lead-arsenic mixtures and alloys and the like. For other semiconductor materials, suitable doping materials and alloys are well known. The doping materials, when charged into tank 40, are found to give best results with an average particle size of from 3 microns to 80 microns.

A cooling fluid, for example, water, air and the like is circulated through the cooling coils 42 surrounding the chambers 12 and 14. The cooling fluid prevents the chamber walls from becoming excessively hot.

The power source 28 which may be from 15 to 30 volts, is activated to establish an arc across the gap between the electrode 24 and metal walls 16 in the vicinity of the orifice opening 20. Power inputs between 5 and 15 kw. can be used. Higher power levels, for example, 100 kw. or higher may be used, depending on the size of the generator.

An inert (nonoxidizing) or noble carrier gas, for example, nitrogen, argon, helium, neon, or mixtures of two or more of said gases, and the like is introduced into chamber 12 through gas inlet passage 32. Nitrogen cannot be used with certain materials, for example, when depositing aluminum since the nitrogen will react with the aluminum to form aluminum nitride. The gas can be introduced at a pressure of from about 5 to 50 p.s.i. and at a flow rate of from 15 to 300 cu. ft. per hour. Very satisfactory results have been achieved when the inert carrier gas was introduced at a rate of approximately 60 cu. ft. per hour.

The gas flows about the electrode 24 and is ionized by the electrical discharge between the electrode 24 and the wall 16 in the vicinity of orifice opening 20. The ionized gas may attain a temperature of up to 20,000° C. or even higher.

The ionized gas or plasma passes through the orifice opening 20 and enters the orifice chamber 14 at a speed approaching or equal to the speed of sound. The gas at this point is a plasma-jet. As the gas passes beneath passageway 36, the doping material 41 is fed thereto from tank 40. In one particular apparatus, the feed rate of from one-half to ten grams per minute was employed. The particles of the doping material become entrained in the plasma-jet and are highly heated therein and accelerated to a high velocity. The exact physical condition of the particles of doping material in the plasma-jet is not known. But the particles are believed to vary from highly heated solid particles with some of the surface partly molten, to entirely molten particles and highly ionized gaseous atoms.

The plasma-jet with the particles of the doping material entrained therein passes through orifice 22 and strikes the unmasked predetermined portion 49 of surface 52 of wafer or body 54 of semiconductor material. Because of the force with which the jet hits the unmasked portion of surface 52 of wafer 54 some of the initial particles of doping material are driven a microscopic distance into the wafer. In any event the state of the particles and the force with which they impinge onto the semiconductor surface result in an excellent bond between the particles and body of semiconductor material. The remainder of particles of doping material are deposited in a series of layers upon the surface of the wafer until a desired thickness is deposited.

For producing diffused regions the wafer 54 is then charged into a fusion furnace and heated to a temperature sufficiently high to ensure diffusion of the doping material into the wafer as well as the fusion of the semiconductor material to the layer of applied material. Examples of suitable fusion temperatures are; for silicon, from 600° C. to 1000° C.; and for germanium from 400°

C. to 600° C. In a modification of this process, the body of semiconductor material may be at an elevated temperature during the deposition of the doping material, thereby eliminating the need for subsequent fusion steps. This could be achieved either by heating the body of semiconductor material and supporting jigs with auxiliary heaters or by adjusting the position of the sample in the plasma or by insulating the sample so that the energy of the plasma is not conducted away and is used to heat the body of semiconductor material.

It will be noted from FIG. 1 that as the plasma-jet expands after passing through orifice 22, it flows around wafer 54 providing an inert atmosphere thereabout, thereby preventing the oxidation of the doping material deposit upon the wafer.

Figure 2:
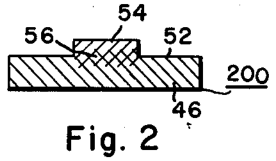
FIG. 2 is a side view in cross-section of a body of semiconductor material processed in accordance with the teachings of this invention.

With reference to FIG. 2, there is illustrated a semiconductor device 200 comprising the wafer 54 of semiconductor material that has been processed in accordance with this invention as described hereinabove. The device 200 is comprised of a first type of semiconductivity in the body of wafer 54, a zone of a second type semiconductivity comprising a layer 158 of the applied contact material and a semiconductor transition region or p-n- junction 56 between zones 54 and 158.

It is to be understood that if the tank 40 of FIG. 1 contained a suitable non-doping ohmic contact material rather than a doping material, the process described hereinabove can be employed to form ohmic contacts or supports on a body of semiconductor material. Examples of suitable materials for forming ohmic contacts include tin, tin-lead alloys, silver, gold, tungsten, tungsten-silver alloys, molybdenum, tantalum, and also, for n-type silicon, silver-antimony, gold-antimony, tungsten, tungsten-antimony, tungsten-silver-antimony with 5% to 10% silver, tungsten-silver-antimony, lead-silver-antimony and the like; for p-type silicon, aluminum, silver-boron, gold-boron, tungsten-boron, tungsten-silver-boron and the like; for n-type germanium, admixtures of tin or tin and lead with arsenic and antimony, lead-antimony, and the like; for p-type germanium, indium, tin-indium alloys and mixtures.

Figure 3:
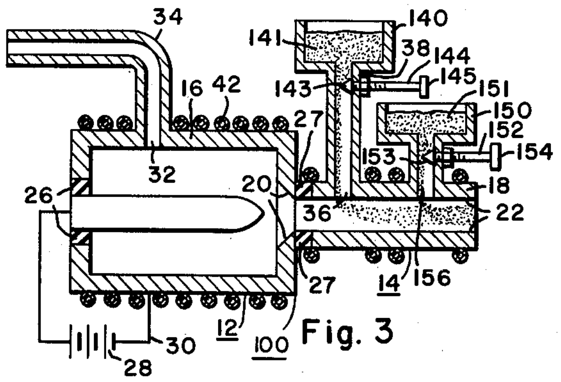
FIG. 3 is a side view in partial cross-section of a modified plasma-jet generator suitable for use in accordance with this invention.

With reference to FIG. 3, there is illustrated a plasma-jet generator 100 which may be used in practicing a modification of the process of this invention. The generator 100 is generally similar to that of FIG. 1, except that it has two tanks 140 and 150 opening into the orifice chamber 14. A valve 144 having a closure tip 143 and operable by handle 145 can be manipulated to close off flow of powder 144 through channel 36 or to permit graduated flow therethrough. Similarly a valve 152 with a closure tip 153 is operable by handle 154 to close off flow of powder 151 or to permit its controlled flow through channel 156.

In practicing the teachings of this invention in connection with FIG. 3, employing the plasma-jet generator 100, one tank, for example tank 140, is filled with a suitable powdered doping material 141 and tank 150 is filled with powdered ohmic contact material 151. Valve 152 is operated to close off channel 156. The doping material 141 from tank 140 is permitted to flow into channel 36 and it is first entrained in the plasma-jet. After a desired amount of the doping material 141 has been deposited upon a semiconductor body, flow from tank 140 is shut off by turning valve 144, the semiconductor body is reversed, and channel 156 from tank 150 is opened whereby the ohmic contact material 151 is deposited by the plasma-jet on the opposite side of the semiconductor body.

The ohmic contact material 151 may be deposited on the applied layer of doping alloy if suitable masking is used to limit the area of the ohmic material 150 so that it is within the upper surface of the doping contact material previously laid down.

The plasma-jet generator 100 illustrated in FIG. 3 and having two tanks 140 and 150, can be used for other modifications of this invention. For example, tank 140 can be filled with one metal or metalloid powder, A, and tank 150 can be filled with another metal or metalloid powder, B. By adjusting the flow from each tank by operation of valves 144 and 152, an alloy with any given proportions of A and B can be laid down on the semiconductor body. Further, the proportions can be adjusted during the deposition to give a deposit of variable composition. Metal powder A could be any inert carrier metal and powder B could be any doping material required to produce a p- or n-type doping action. Metals A and B may be any desired materials for producing only ohmic contacts or powders A and B could be any desired doping materials to be used in combination with one another. In still another modification powder A could be an ohmic contact or doping material and powder B could be a bonding metal such as silver or gold. For such a modification powder A would be laid down on a semiconductor body first and metal powder B would be laid down on top of the ohmic material A for ease in joining by soldering or brazing the ohmic metal region to another metal such as a heat sink or an encapsulation device.

Essentially the same result as that described immediately above can be realized by passing the body of semiconductor material past two plasma-jet generators.

In still another modification of the present invention, powders of the doping material and ohmic contact material are admixed in one tank and such admixture is deposited upon the body of semi-conductor material at the same time. Powders of tungsten, tantalum and molybdenum can be admixed with p- and n-type doping materials. This method is particularly useful when tungsten is combined with an n- or p-type doping material in the fabrication of silicon semiconductor devices and when tantalum has been used with an n- or p-type doping material in the fabrication of germanium semiconductor devices. For example, small quantities of p-type impurities, such as boron or aluminum, can be mixed with tungsten powder and deposited by the plasma-jet generator onto a sample of p-type silicon. The presence of p-type impurities, such as boron or aluminum, will help in achieving a lower resistance contact between the p-type silicon wafer and the metal contact. Heating at temperatures of 600° C. to 1200° C. may further lower the resistance of the contacts and some of the boron or aluminum will diffuse into the silicon wafer. By depositing tungsten with p-type impurities, such as boron or aluminum, onto n-type silicon and heating the same to a higher temperature (800° C. to 1200° C.) for several hours, diffusion of the p-type impurity will produce a p-n junction at a short distance from the surface. The tungsten contact thereby provides a good ohmic contact to the thin diffused layer whose coefficient of expansion is well matched to that of silicon. The problem of making good ohmic contacts to large-area diffused regions is difficult to effect by the prior art techniques.

By mixing small quantities of n-type impurities, such as phosphorus, arsenic or antimony with tungsten powder and applying the mixture by plasma-jet projection improved ohmic contacts can be made to n-type silicon, after applying such mixture by plasma-jet projection, p-n junctions can be produced in p-type silicon by diffusing the applied doping material by heating the units at high temperatures.

Similarly good results may be obtained by using the plasma-jet generator to deposit tantalum powder, which has a coefficient of expansion well matched to germanium, admixed with small quantities of doping impurities to either p- or n-type germanium. The addition of p-type impurities, such as boron, aluminum, or indium, to tantalum being deposited onto p-type geramanium will improve the quality of the ohmic contact. After application by the plasma-jet generator and heating, the mixture will produce a diffused p-n junction on n-type germanium.

Deposition of tantalum containing small quantities of n-type impurities such as phosphorus, arsenic and antimony will improve the quality of the ohmic contact on n-type germanium or it may be heated to produce a diffused junction on p-type germanium.

In still another application of the apparatus of FIG. 3 of the present invention, the plasma-jet generator can be used in the manner described above to establish a "graded metal" layer upon a body of semiconductor material. For example, a first contact metal, such as tungsten, is deposited; as the layer approaches the desired thickness copper can be mixed with the tungsten in gradually increasing amounts while the tungsten is being gradually reduced until finally a layer of pure copper is deposited. Another useful example of graded metal layers is tungsten and silver. Such graded metal procedures will eliminate solder fatigue problems and make possible the satisfactory use of soft solders in joining semiconductor devices having tungsten supports to heat sinks or other encapsulation bodies. If desired or required a "graded layer" comprised of metals of gradually increasing expansion coefficients could be deposited readily on a semiconductor body, for example, a "graded metal" layer comprised of successive layers of tungsten-tantalum-iron-nickel-copper could be deposited upon a silicon semiconductor body.

Figure 4:
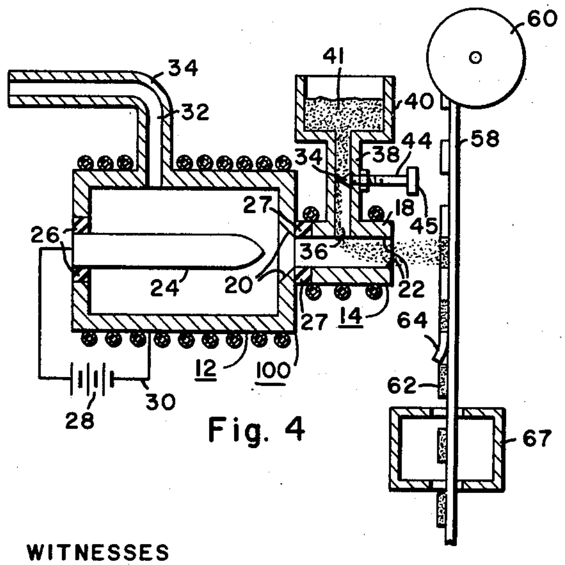
FIG. 4 is a side view in partial cross-section of the plasma-jet generator of FIG. 1 and a continuous strip of a dendritic crystal of a semiconductor material undergoing processing in accordance with the teachings of this invention.

The process of this invention readily lends itself to the fabrication of a continuous dendritic crystal of a semiconductor material crystallizing in the diamond cubic lattice structure, into either a plurality of semiconductor devices or into a single multi-emitter multi-collector, common base device. With reference to FIG. 4, in one method of fabricating a continuous strip of a dendritic crystal into a semiconductor device; a continuous strip 58 of a dendritic material of a semiconductor material is fed from a reel 60 and passed before the plasma-jet generator 10 of FIG. 1. The dendritic crystal was prepared in accordance with the teachings of U.S. patent application Serial No. 757,832, filed August 28, 1958, now abandoned, and Serial No. 829,069, filed July 23, 1959. The dendritic crystal may be either n- or p-type semiconductor material. The tank 40 of the generator 10 is charged with a suitable doping material 41. The strip 58 is passed in front of orifice 22 of generator 10 and a series of layers 62 of the doping material 41 deposited thereon through apertures of a mask 64 by the procedure described hereinabove. The strip 58 then passes through a fusion furnace 67.

The strip 58 is suitably masked by a metal or ceramic mask 64 so that the doping material is only deposited upon predetermined areas. Alternatively, the doping material may be deposited over the entire surface of the dendritic crystal, and the crystal then selectively etched to remove the undesired doping material, and finally passed into a fusion furnace.

Figure 5:
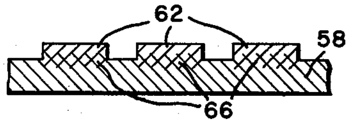
FIG. 5 is a side view in cross-section of a dendritic crystal processed in accordance with the teachings of this invention.

A portion of the resulting device structure is illustrated in FIG. 5. The structure is comprised of the original dendritic crystal 58 having a first type of semiconductivity, layers 62 having a second type of semiconductivity, and a p–n junction 66 between the zones of first and second types semiconductivity.

Figure 6:
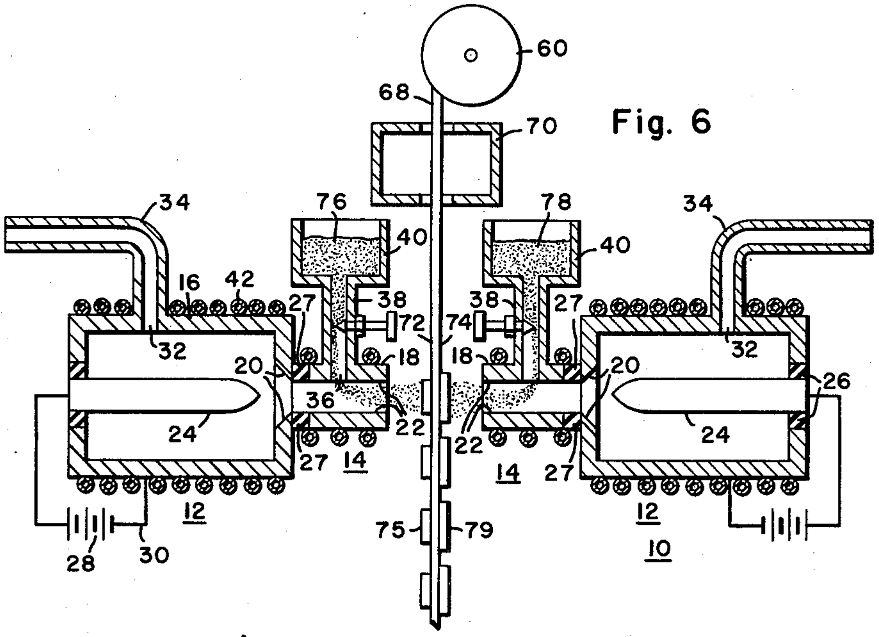
FIG. 6 is a side view in partial cross-section of a continuous strip of a dendritic crystal undergoing processing by two plasma-jet generators simultaneously in accordance with the teachings of this invention.

With reference to FIG. 6, there is illustrated still another modification of the present invention. In this modification, a continuous strip 68 of an elongated dendrite crystal having a first type of semiconductivity is drawn from reel 60 and passed through a furnace 70. The furnace 70 heats the dendrite crystal 68 to an elevated temperature sufficient to fuse any metal layer deposited thereon. The dendrite is then passed between two plasma-jet generators 10 and 110 disposed on opposite sides thereof. The tank 40 of generator 10 is loaded with a suitable doping material 76 and tank 240 of generator 110 is loaded with a suitable ohmic contact material 78. As strip 68 passes between generators 10 and 110 one surface 72 of strip 68 has deposited thereon at predetermined intervals a plurality of separated layers 75 of the doping material 76, and the other surface 74 has deposited thereon at predetermined intervals a plurality of separated layers 79 of the ohmic contact material 78. Since the strip 68 is at an elevated temperature, the layers 75 of doping material and layers 79 of ohmic contact material 78 fuse onto and diffuse into the strip 68 on contact.

Figure 7:
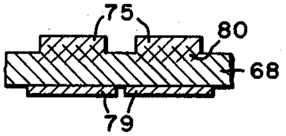
FIGS. 7 and 8 are side views in cross section of strips of a dendritic crystal processed in accordance with the teachings of this invention.

The resultant structure is illustrated in FIG. 7 which is comprised of the original dendrite 68 having a first type of semiconductivity, and layers 75 comprised of the doping material fused onto the dendritic material and having a second type semiconductivity, thereby producing a p-n junction 80 between the two zones of different type semiconductivity. The ohmic contact layers 79 are comprised of the fused layers of ohmic contact material 78. The strip 68 can be processed further to provide leads and be divided into a plurality of semiconductor diode devices.

Figure 8:
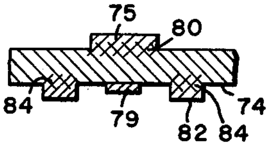

The devices of FIGURE 7 are diodes. Transistors can be figured by the employment of a third plasma-jet generator, a second doping contact, for example, an emitter contact, of, for instance, circular or rectangular configuration, could be affixed to surface 74 of the strip 68 of FIGS. 6 and 7, about the contact 79. The configuration of this structure is illustrated in FIG. 8. The structure is comprised of the dendrite 68 having a first type of semiconductivity, a layer 75 comprised of doping material fused into the surface 72 of the dendritic and having a second type of semiconductivity to provide the p-n junction 80, an ohmic base contact comprised of the layers 79, and a ring 82 disposed about layer 79 comprised of a suitable doping material opposite to the semiconductivity of the dendrite fused onto surface 74 of the dendritic material, to provide a second p–n junction 84.

Semiconductor devices prepared in accordance with the teachings of this invention may be identified upon examination.

The following examples are illustrative of the practice of this invention.

*Example I*

One surface of an n-type silicon wafer having a diameter of ⅜ inch was selectively masked with a perforated steel sheet. The perforation formed an unmasked area of substantially circular configuration of a diameter of approximately 0.25 inch.

The masked n-type wafer was disposed approximately 1$\frac{9}{16}$ inches from the discharge orifice of a plasma-jet generator of the type illustrated in FIG. 1 with the unmasked area in line with the discharge orifice.

Argon was fed into the first chamber of the generator at a rate of about 60 cu. ft. per hour.

A current of 200 amps and at a 22 volt potential was provided to establish an arc between the tip of a tungsten electrode and the chamber wall in the area of the orifice 20. The argon gas was ionized by the arc. As the ionized gas passed through the orifice chamber 14 at a speed approaching the speed of sound, aluminum particles, having an average particle size of 20 microns, were introduced from the tank 40 at a rate of approximately .54 gram per minute and mixed with the plasma gas jet.

Upon discharge from the generator, the plasma gas jet with the entrained aluminum particles struck the n-type silicon wafer and the aluminum particles were deposited upon the unmasked area thereof. After approximately 2 seconds, the generator was shut off. The n-type silicon wafer was found to have a coating of approximately 4 mils thick of aluminum upon the unmasked area.

The aluminum coated wafer was then heated to a temperature of approximately 850° in a vacuum of approximately $10^{-5}$ mm. Hg and then cooled within a period of 45 minutes to room temperature. A p-n junction was formed in the silicon wafer by the dissolved silicon which recrystallized when the molten aluminum cooled. The device was then post-etched in an etching composition comprised of (all parts by volume) 5 parts concentrated nitric acid and one part hydrofluoric acid, and subsequently dried well.

Figure 9:
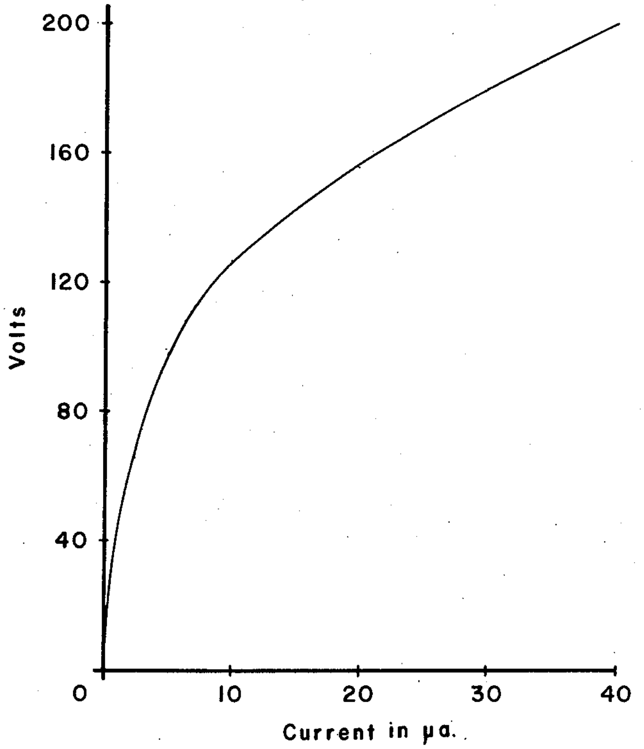
FIG. 9 is an I–V characteristic curve of a p-n junction diode prepared in accordance with the teachings of this invention.

Contacts were affixed to the p- and n-type regions of the wafer, and the I-V characteristics of the device determined. The I-V characteristics are illustrated in FIG. 9. It will be noted from FIG. 9 that the device had a low reverse leakage and a peak inverse voltage consistent with the resistivity (15 ohm-cm.) of the silicon material.

*Example II*

One surface on an n-type silicon wafer having a diameter of ⅝ inch was selectively masked with a perforated steel sheet. The unmasked area was of substantially circular cross configuration and had a diameter of approximately 0.25 inch. The n-type wafer was disposed approximately 1.5 inches from the discharge orifice of a plasma-jet generator of the type illustrated in FIG. 1. The unmasked area of the wafer surface was in line with the discharge orifice.

Argon gas was fed into the first chamber at a rate of about 50 cu. ft. per hour.

A current of 300 amperes and a 21.5 volt potential was provided to establish an arc between the tip of the tungsten electrode and the chamber wall in the area of the orifice 20. The argon gas was ionized by the arc. As the ionized gas passed through the orifice chamber 14 as a plasma-jet at a speed approaching the speed of sound, tungsten particles, having an average particle size of 22 microns, were introduced from the tank 40 at a rate of approximately 4 grams per minute and mixed with the plasma-jet.

Upon discharge from the generator, the plasma-jet and tungsten particles struck the n-type silicon wafer and the tungsten particles were deposited upon the unmasked area thereof.

After approximately 10 seconds the generator was shut off. The n-type silicon wafer was found to have a well bonded coating approximately 5 mils thick of tungsten particles upon the uncoated area.

The resistance of the tungsten coated n-type silicon wafer was measured and found to be low, indicating a low resistance ohmic bond between the tungsten and silicon. The tungsten-coated wafer was then subject to several thermal cycles consisting of 5 minutes at −40° C., 2 minutes at 25° C., and 5 minutes at 210° C. to 220° C. There was no indication of any cracking through the silicon or any tendency for the tungsten-silicon bond to fracture.

*Example III*

One surface of a p-type silicon wafter having a diameter of ⅝ inch was selectively masked with a graphite mask. The unmasked area is of substantially circular configuration and had a diameter of approximately 0.25 inch.

The p-type wafer was disposed approximately 1½ inches from the discharge orifice of a plasma-jet generator of the type illustrated in FIG. 1. The unmasked area of the wafer surface was in the line with the discharge orifice.

Argon gas was fed into the first chamber at a rate of about 60 cu. ft. per hour. A current of 200 amperes and 20 volts was provided to establish an arc between the tip of the tungsten electrode and the chamber wall in the area of the orifice 20. The argon gas was ionized by the arc.

As the ionized gas passed through the orifice chamber 14 as a plasma-jet, having a speed approaching the speed of sound, metal particles comprised of 99.5% by weight gold and 0.5% by weight antimony, having an average particle size of 12 microns, were introduced from the tank 40 at a rate of approximately 3 grams per minute, and mixed with the plasma-jet.

Upon discharge from the generator, the plasma-jet and gold-antimony alloy particles struck the p-type silicon wafer and the gold antimony particles were deposited upon the unmasked area thereof.

After approximately 10 seconds the generator was shut off. The p-type silicon wafer was found to have a coating approximately 4 mils thick of gold-antimony particles upon the uncoated area.

The gold-antimony coated wafer was then heated to a temperature of approximately 850° C. in a vacuum and then cooled to room temperature. An n-p junction was formed in the silicon wafer by the dissolved gold-antimony and silicon which recrystallized upon cooling. The device was post-etched in an etching consisting of (all parts by volume) 5 parts concentrated nitric acid and 1 part by weight hydrofluoric acid and was subsequently dried well.

*Example IV*

One surface of a p-type silicon wafer having a diameter of ⅝ inch was selectively masked with steel. The unmasked area was of substantially circular configuration and had a diameter of approximately 0.25 inch. The p-type wafer was disposed approximately 1⅛ inches from the discharge orifice of the plasma-jet generator of the type illustrated in FIG. 1. The unmasked area of the wafer surface was in line with the discharge orifice. Argon gas was fed into the first chamber at a rate of about 60 cu. ft. per hour.

A current of 350 amperes and a 23 volt potential was provided to establish an arc between the tip of the tungsten electrode and the chamber wall in the area of the orifice 20. The argon gas was ionized by the arc. As the ionized gas passed through the orifice chamber 11 as a plasma-jet having a speed approximating the speed of sound, tungsten particles having an average particle size of about 8 microns were introduced from the tank 40 at a rate of approximately 2 grams per minute and mixed with the plasma-jet.

After discharge from the generator, the plasma-jet and tungsten particles struck the n-type silicon wafer and the tungsten particles were deposited upon the unmasked area thereof.

After approximately 7 seconds, the generator was shut off. The p-type silicon wafer was found to have a coating of approximately 5 mils thick of tungsten upon the uncoated surface.

The resistance of the tungsten-coated p-type silicon wafer was measured and found to be low, indicating a low-resistance bond between the silicon and tungsten. The tungsten-coated silicon wafer was then subject to several thermal cycles consisting of 5 minutes at −40° C., 2 minutes at 25° C. and 5 minutes at a temperature between 210° C. and 220° C. No indication of any cracking between the silicon and the tungsten was observed.

*Example V*

One surface of an n-type germanium wafer having a diameter of ⅝ inch was selectively masked with a steel mask. The unmasked area was of substantially circular configuration and had a diameter of approximately 0.25 inch. The n-type germanium wafer was disposed approximately 1⅝ inches from the discharge orifice of a plasma-jet generator of the type illustrated in FIG. 1. The unmasked area of the wafer surface was in line with the discharge orifice.

Argon gas was fed into the first chamber at a rate of about 60 cu. ft. per hour.

A current of 100 amperes and a 21.5 volt potential was provided to establish an arc between the tungsten electrode and the chamber wall in the area of the orifice 20. The argon gas was ionized by the arc.

As the ionized argon gas passed through the orifice chamber 14 as a plasma-jet at a speed approaching the speed of sound, indium particles having an average particle size of −200 mesh (U.S. Standard), were introduced from the tank 40, at a rate of approximately .975 gram per minute, and mixed with the plasma-jet.

Upon discharge from the generator, the plasma-jet and indium particles struck the n-type germanium wafer and the indium particles were deposited upon the unmasked area thereof.

After approximately 2 seconds, the generator was shut off. The n-type germanium wafer was found to have a coating approximately 4 mils thick of indium particles upon the uncoated area.

The indium-coated germanium wafer was then heated to a temperature of approximately 500° C. in a vacuum and then cooled within a period of 5 minutes to room temperature. A p-n junction was formed in the germanium wafer by the dissolved germanium which recrystallized with indium particles trapped within the lattice structure thereof. The device was then post-etched in an etchant consisting of 3 parts (by volume) hydrofluoric acid, 1 part (by volume) concentrated nitric acid, and 1 part (by volume) glacial acetic acid.

Contacts were fixed to the p- and n-type regions of the wafer, and the I–V characteristics of the device determined and found to be satisfactory.

*Example VI*

One surface of a p-type germanium wafer having a diameter of ⅝ inch was selectively masked with a perforated brass sheet. The unmasked area was of substantially circular configuration and had a diameter of approximately 0.25 inch. The p-type germanium wafer was disposed approximately 1 7/16 inches from the discharge orifice of a plasma-jet generator of the type illustrated in FIG. 1. The unmasked area of the wafer surface was in line with the discharge orifice.

Argon gas was fed into the first chamber at a rate of about 60 cu. ft. per hour.

A current of 200 amperes and a 21 volt potential was provided to establish an arc between the tungsten electrode and the chamber wall in the area of the orifice 20. The argon gas was ionized by the arc.

As the ionized gas passed through the orifice chamber 14 as a plasma-jet at a speed approaching the speed of sound, tin particles having an average particle size of −325 mesh (U.S. Standard sieve), were introduced from tank 40, at a rate of approximately 1.12 grams per minute, and mixed with the plasma-jet.

Upon discharge from the generator, the plasma-jet and tin particles struck the p-type germanium wafer and the tin particles were deposited upon the unmasked area thereof.

After approximately 2 seconds, the generator was shut off. The p-type germanium wafer was found to have a coating approximately 4 mils thick of tin upon the uncoated area.

The resistance of the tin coated p-type germanium was measured and found to be low, indicating a low resistance bond between the tin and germanium. The tin-coated wafer was then subject to several thermal cycles consisting of 5 minutes at −40° C., 2 minutes at 25° C., and 5 minutes at 210° C. to 220° C. There was no indication of any cracking through the germanium or any tendency for the tin-germanium bond to fracture.

While the invention has been described with reference to particular embodiments and examples, it will be understood, that modifications, substitutions and the like may be made therein without departing from its scope.

I claim as my invention:

1. A process for applying a layer of material to a body of a semiconductor material comprising projecting at a high velocity approaching the speed of sound and at a high temperature an admixture comprised of finely divided metal particles and an ionized inert gas against a predetermined surface area of said body of said semiconductor material, whereby, a well bonded layer of said metal particles is deposited upon said predetermined surface area of said body of semiconductor material, said ionized inert gas serving as a carrier for said metal particles, and said bonded layer of metal particles being in an electrical contact relationship with said body of semiconductor material.

2. A process for affixing an ohmic contact to a body of a semiconductor material comprising directing a high temperature, high velocity plasma-jet consisting of an intimate admixture of an ionized inert gas and particles of an ohmic electrical contact material against a predetermined portion of said body of semiconductor material, said ionized inert gas serving as a carrier for said particles, whereby, a plurality of layers of the ohmic contact metal are bonded to the predetermined portion of the body of semiconductor material, said bonded layer of metal particles being in an electrical contact relationship with said body of semiconductor material.

3. A process for affixing an ohmic electrical contact to a body of a semiconductor material, comprising directing a high temperature, high velocity, plasma-jet comprised of an intimate admixture of an ionized inert gas and particles of at least two ohmic electrical contact metals against a predetermined portion of said body of semiconductor material, said ionized inert gas serving as a carrier for said particles, whereby a plurality of layers of the ohmic contact metals are established on and bonded to the predetermined portion of the body of semiconductor material, said bonded layer of metal particles being in an electrical contact relationship with said body of semiconductor material.

4. A process for affixing an ohmic electrical contact to a body of a semiconductor material, comprising directing a first high temperature, high velocity plasma-jet comprised of an intimate admixture of an ionized inert gas and particles of an ohmic electrical contact metal against a predetermined portion of said body of semiconductor material, said ohmic contact material having a coefficient of thermal expansion substantially equal to that of the coefficient of thermal expansion of the semiconductor material, whereby a plurality of layers of the first ohmic contact metal are established on the predetermined portion of the body of semiconductor material, and thereafter directing a second high temperature, high velocity plasma-jet comprised of an intimate admixture of an ionized inert gas and particles of a second ohmic electrical contact metal against the plurality of layers of first ohmic contact metal, said second ohmic contact metal having a coefficient of thermal expansion substantially different from that of the semiconductor material, whereby a plurality of layers of the second ohmic contact metal are established upon the layers of first ohmic contact material.

5. A process for affixing ohmic electrical contacts to a body of semiconductor material, comprising depositing a plurality of layers of at least three ohmic contact metals upon a predetermined area of a surface of said semiconductor material by the use of a high temperature, high velocity plasma-jet, said plasma jet consisting of an admixture of finely divided metal particles and an inert ionized gas, said ionized inert gas serving as a carrier for said particles, each succeeding ohmic contact material having a coefficient of thermal expansion substantially different than that of the semiconductor material, said ohmic contact metals being in an electrical contact relationship with said body of semiconductor material.

6. A process for forming a semiconductor transition region within a body of a semiconductor material comprising directing a high temperature, high velocity plasma-jet consisting of an intimate admixture of an ionized inert gas and particles of at least one suitable doping material against a predetermined portion of said body of semiconductor material, said ionized inert gas serving as a carrier for said particles, whereby said particles of doping material are driven into and coalesce with said body of semiconductor material at a predetermined location upon at least one surface of said body of semiconductor material said predetermined portion of said body of semiconductor material containing said doping material being of a different semiconductivity than the remainder of the body.

7. A process for forming a semiconductor transition region within a body of a semiconductor material comprising directing a high temperature, high velocity plasma-jet consisting of an intimate admixture of an inert ionized gas and particles of at least one suitable doping material against a predetermined portion of said body of semiconductor material, whereby said particles of doping material are driven into and coalesce with said body of semiconductor material at a predetermined location upon at least one surface of said body of semiconductor material and fusing said particles of doping material with said body of semiconductor material.

8. A process for forming a semiconductor transition region within a body of a semiconductor material, comprising directing a high temperature, high velocity plasma-jet consisting of an intimate admixture of an ionized inert gas and particles of at least one suitable doping material against a predetermined portion of said body of semiconductor material, whereby said particles of doping material are driven into and coalesce with said body of semiconductor material at a predetermined location upon at least one surface of said body of semiconductor material, heating said coalesced body of semiconductor material and doping material, whereby said particles of doping material melt and dissolve a portion of said semiconductor material, and cooling said body of semiconductor material and doping material, whereby, the dissolved semiconductor material recrystallizes with doping materials trapped within the lattice structure thereof.

9. A process for affixing electrical contacts to a body of a semiconductor material, comprising directing a first high temperature, high velocity plasma-jet comprised of an intimate admixture of an ionized gas and particles of at least one suitable doping material against a predetermined portion of one surface of said body of semiconductor material, and thereafter directing a second high temperature, high velocity plasma-jet comprised on an intimate admixture of an ionized gas and particles of at least one suitable electrical ohmic contact material against said previously deposited suitable doping material.

10. A process for affixing electrical contacts to a body of a semiconductor material comprising directing a first high temperature, high velocity plasma-jet comprised of an intimate admixture of an ionized gas and particles of at least one suitable doping material against a predetermined portion of one surface of said body of semiconductor material, and thereafter directing a second high temperature, high velocity plasma-jet comprised of an intimate admixture of an ionized gas and particles of at least one suitable electrical ohmic contact material against the deposited doping material, and thereafter fusing said doping material into said body of semiconductor material.

11. A process for affixing an electrical contact to a dendritic crystal of a semiconductor material crystallizing in the diamond-cubic-lattice structure comprising directing a high temperature, high velocity, plasma-jet comprised of an intimate admixture of an ionized inert gas and particles of a good electrical contact material against a series of predetermined portions of said body of dendritic crystal, said ionized inert gas serving as a carrier for said particles, whereby a plurality of layers of the contact material are established and bonded to the body at a series of predetermined positions upon the body of dendritic crystal, said bonded layer of metal particles being in an electrical contact relationship with said body of semiconductor material.

12. A process for affixing electrical contacts to a body of a semiconductor material, comprising directing a high temperature, high velocity plasma-jet comprised of an intimate admixture of ionized gas and a mixture of metal particles comprised of at least one doping material and at least one ohmic contact material against a predetermined portion of one surface of said body of semiconductor material, whereby a mixture of said metal particles are disposed in a plurality of layers upon said predetermined portion of one surface of the body of semiconductor material, and thereafter heating said body of semiconductor material to a temperature sufficient to cause the deposited doping material to diffuse thereinto.

References Cited by the Examiner

UNITED STATES PATENTS

| | | | |
|---|---|---|---|
| 1,159,383 | 11/15 | Holsten | 219—76 X |
| 2,829,422 | 4/58 | Fuller | 29—25.3 |
| 2,840,494 | 6/58 | Parker | 29—25.3 X |
| 2,842,831 | 7/58 | Pfann | 29—25.3 |
| 2,846,346 | 8/58 | Bradley | 148—33 |
| 2,861,900 | 11/58 | Smith et al. | 117—105 |
| 2,863,105 | 12/58 | Ross | 317—234 |
| 2,885,571 | 5/59 | Williams et al. | 307—88.5 |
| 2,906,930 | 9/59 | Raithel | 317—234 |
| 2,907,934 | 10/59 | Engel | 317—234 |
| 2,917,684 | 12/59 | Becherer | 317—234 |
| 2,922,869 | 1/60 | Giannini et al. | 219—75 |
| 2,930,949 | 3/60 | Roschen | 317—235 |
| 2,972,550 | 2/61 | Pelton. | |
| 3,050,667 | 8/62 | Emeis | 29—25.3 X |
| 3,051,878 | 8/62 | Finn | 29—25.3 X |
| 3,083,595 | 4/63 | Frank. | |
| 3,094,634 | 6/63 | Rappaport | 29—25.3 |

FOREIGN PATENTS

| | | |
|---|---|---|
| 204,359 | 7/59 | Austria. |
| 563,516 | 1/58 | Belgium. |
| 548,523 | 11/57 | Canada. |
| 869,791 | 6/61 | Great Britain. |

RICHARD H. EANES, Jr., *Primary Examiner.*

SAMUEL BERNSTEIN, WHITMORE A. WILTZ, *Examiners.*